United States Patent
Cooper et al.

(10) Patent No.: US 10,844,481 B2
(45) Date of Patent: Nov. 24, 2020

(54) COMPOSITE REFRACTORY COATINGS AND APPLICATIONS THEREOF

(71) Applicant: Kennametal Inc., Latrobe, PA (US)

(72) Inventors: Rodrigo Alejandro Cooper, Houston, TX (US); Karl Heinz Wendt, Ebermannstadt (DE); Peter Leicht, Latrobe, PA (US); Bhaskar Alok, Bangalore (IN); Yixiong Liu, Greensburg, PA (US)

(73) Assignee: KENNAMETAL INC., Latrobe, PA (US)

(*) Notice: Subject to any disclaimer, the term of this patent is extended or adjusted under 35 U.S.C. 154(b) by 35 days.

(21) Appl. No.: 16/386,960

(22) Filed: Apr. 17, 2019

(65) Prior Publication Data

US 2019/0242013 A1  Aug. 8, 2019

Related U.S. Application Data

(63) Continuation of application No. 15/253,460, filed on Aug. 31, 2016, now Pat. No. 10,273,575.

(51) Int. Cl.
| | |
|---|---|
| *C23C 14/40* | (2006.01) |
| *C23C 16/40* | (2006.01) |
| *C23C 16/02* | (2006.01) |
| *C23C 16/56* | (2006.01) |
| *C23C 28/00* | (2006.01) |

(Continued)

(52) U.S. Cl.
CPC .......... *C23C 16/40* (2013.01); *C23C 16/0272* (2013.01); *C23C 16/44* (2013.01); *C23C 16/56* (2013.01); *C23C 28/042* (2013.01); *C23C 28/044* (2013.01); *C23C 28/32* (2013.01);

(Continued)

(58) Field of Classification Search
USPC .......... 51/307, 309; 428/697, 698, 699, 701, 428/702
See application file for complete search history.

(56) References Cited

U.S. PATENT DOCUMENTS 4,702,970 A * 10/1987 Sarin .................. C04B 41/5025
                                                          51/309
4,749,629 A *  6/1988 Sarin .................... C23C 16/405
                                                          428/701

(Continued)

FOREIGN PATENT DOCUMENTS

| JP | 2006-289557 | * 10/2006 |
| JP | 2009-066742 | *  4/2009 |
| JP | 2012-143825 | * 11/2011 |

OTHER PUBLICATIONS

Martensson "Influence of the concentration of ZrCl4 on texture, morphology and growth rate of CVE grown aplha-Al2O3 coatings deposited by the AlCl3/ZrCl4/H2/Co2/H2S process" Surface & Coating Tech 200 p. 3626-3632. (Year: 2006).*

*Primary Examiner* — Archene A Turner
(74) *Attorney, Agent, or Firm* — Larry R. Meenan

(57) ABSTRACT

In one aspect, articles are described comprising wear resistant coatings employing one or more composite refractory layers. For example, a coated article described herein comprises a substrate and a coating deposited by CVD adhered to the substrate, the coating including a multiphase refractory layer comprising an alumina phase and a zirconia phase, wherein the zirconia phase has a texture coefficient for the (200) growth direction, TC(200), greater than 4.

20 Claims, 6 Drawing Sheets

(51) Int. Cl.
    *C23C 16/44* (2006.01)
    *C23C 28/04* (2006.01)
(52) U.S. Cl.
    CPC ............ *C23C 28/34* (2013.01); *C23C 28/347* (2013.01); *C23C 28/3455* (2013.01)

(56) References Cited

U.S. PATENT DOCUMENTS

| 7,276,301 | B2* | 10/2007 | Tsushima | C23C 16/0272 |
| | | | | 428/702 |
| 7,597,511 | B2* | 10/2009 | Tomita | C23C 16/0272 |
| | | | | 51/307 |
| 2014/0287229 | A1* | 9/2014 | Wendt | C23C 16/40 |
| | | | | 428/697 |

* cited by examiner

COMPOSITE REFRACTORY COATINGS AND APPLICATIONS THEREOF

RELATED APPLICATION DATA

The present application is a continuation application of U.S. patent application Ser. No. 15/253,460 filed Aug. 31, 2016.

FIELD

The present invention relates to refractory coatings and, in particular, to composite refractory coatings deposited by chemical vapor deposition (CVD) for cutting tool and/or wear applications.

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools.

SUMMARY

In one aspect, articles are described comprising wear resistant coatings employing one or more composite refractory layers. Briefly, a coated article described herein comprises a substrate and a coating deposited by CVD adhered to the substrate, the coating including a multiphase refractory layer comprising an alumina phase and a zirconia phase, wherein the zirconia phase has a texture coefficient for the (200) growth direction, TC(200), greater than 4, the texture coefficient (TC) being defined as:

$$TC(hkl) = \frac{I(hkl)}{I_o(hkl)} \left\{ \frac{1}{n} \sum \frac{I(hkl)}{I_o(hkl)} \right\}^{-1}$$

where
I(hkl)=measured intensity of the (hkl) reflection
$I_o$(hkl)=standard intensity of the (hkl) reflection according to International Center for Diffraction Data (ICDD) card 00-037-1484
n=number of reflections used in the TC calculation
(hkl) reflections used in the TC calculation are (−111), (111), (200), (−112), (220) and (−221).

In some embodiments, the alumina phase is doped with zirconium. Additionally, the ratio of aluminum to zirconium in the multiphase refractory layer, in some embodiments, is from 1.5 to 3.

These and other embodiments are described further in the detailed description which follows.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, articles are described comprising refractory coatings employing composite architectures. Articles having such refractory coatings, in some embodiments, are suitable for high wear and/or abrasion applications such as metal cutting operations. Turning now to specific components, a coated article comprises a substrate. A coated article can comprise any substrate not inconsistent with the objectives of the present invention. For example, a substrate can be a cutting tool or tooling used in wear applications. Cutting tools include, but are not limited to, indexable cutting inserts, end mills or drills. Indexable cutting inserts can have any desired ANSI standard geometry for milling or turning applications. Substrates of coated articles described herein can be formed of cemented carbide, carbide, ceramic, cermet, steel or other alloy. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 1 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

Figure 1:
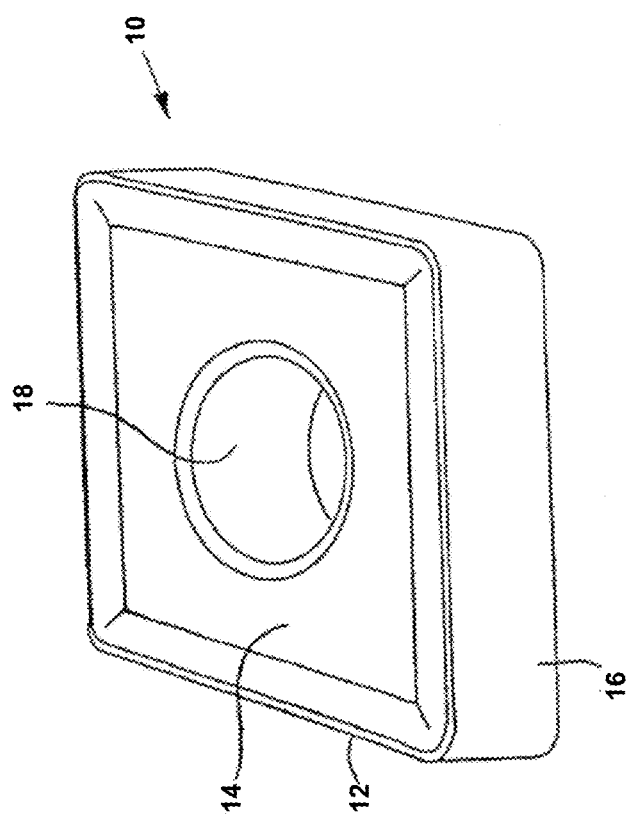
FIG. 1 illustrates a substrate of a coated cutting insert according to some embodiments described herein.

A cutting tool substrate can comprise one or more cutting edges formed at the juncture of a rake face and flank face(s) of the substrate. FIG. 1 illustrates a cutting insert substrate according to one embodiment described herein. As illustrated in FIG. 1, the substrate (10) has cutting edges (12) formed at junctions of the substrate rake face (14) and flank faces (16). The substrate (10) also comprises an aperture (18) for securing the substrate (10) to a tool holder.

As described herein, a CVD coating adhered to the substrate comprises a multiphase refractory layer comprising an alumina phase and a zirconia phase, wherein the zirconia phase has a TC(200) greater than 4, the texture coefficient being defined as $$TC(hkl) = \frac{I(hkl)}{I_o(hkl)} \left\{ \frac{1}{n} \sum \frac{I(hkl)}{I_o(hkl)} \right\}^{-1}$$

where
I(hkl)=measured intensity of the (hkl) reflection
$I_o$(hkl)=standard intensity of the (hkl) reflection according to International Center for Diffraction Data (ICDD) card 00-037-1484
n=number of reflections used in the TC calculation
(hkl) reflections used in the TC calculation are (−111), (111), (200), (−112), (220) and (−221).
In some embodiments, the TC(200) has a value selected from Table I.

TABLE I

| TC(200) for ZrO$_2$ Phase |
|---|
| ≥4.5 |
| ≥5 |
| ≥5.5 |
| 4.1-6 |

Figure 2:
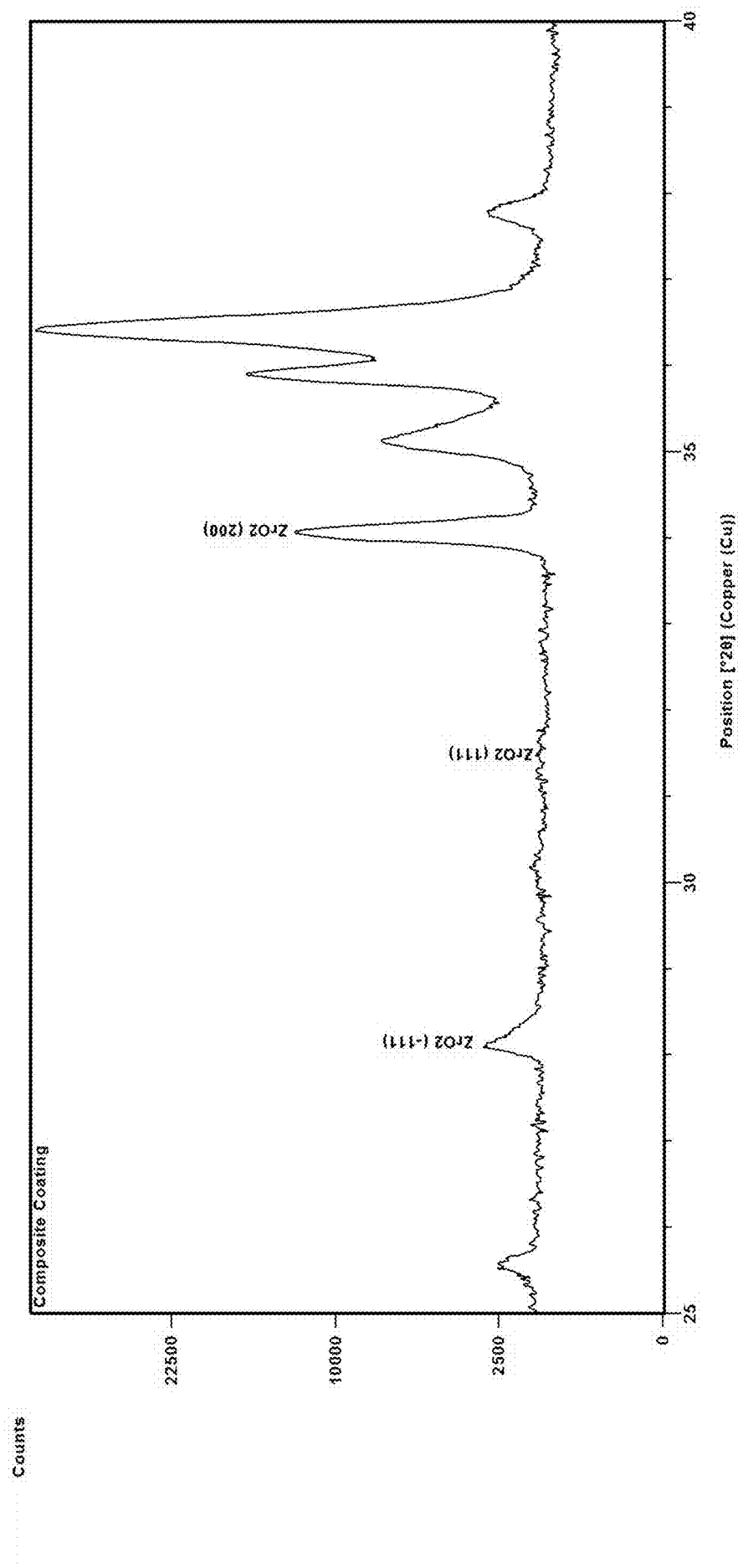
FIG. 2 is an XRD of a multiphase refractory layer illustrating the zirconia phase according to one embodiment.

In some embodiments, TC(−111), TC(111), TC(−112), TC(220) and TC(−221) are all simultaneously less than 1. FIG. 2 is an XRD of a multiphase refractory layer illustrating the zirconia phase according to one embodiment.
The XRD peak data for calculation of the TC(200) is measured on a Bragg focusing diffractometer.
Incidence Optics Included:
Long fine focus X-ray tube operating at 45 KV and 40 MA.
Variable divergence optic operating in automatic mode to insure constant irradiated sample volume throughout the analysis.
Fixed Antiscatter Slit
Receiving Optics Included:
Variable Antiscatter slit operating in automatic mode to match the automatic divergence slit Multistrip solid state detector operating in scanning mode.
Scan parameters (speed and count time) are selected to insure a minimum of ten data steps across the peak full width at half max (FWHM) and approximately 10,000 total counts on the most intense peak. Collected data is first converted from variable mode to fixed mode usable for analysis. This conversion is completed using the formula:

$$I_{FIX}(\theta, a) = I_{ADS}(\theta, L) \times \left(\frac{R \sin(a/2)}{L}\right) \times \left(\frac{1}{\sin(\theta + a/2)} + \frac{1}{\sin(\theta - a/2)}\right)$$

where a=the divergence angle and L=the irradiated length on the sample The corrected intensity is analyzed using peak finding software to identify the peak position of all peaks in the collected data. The peaks are then refined using a profile function to precisely identify the peak position and peak height. This peak data is used for both the zirconia texture coefficient analysis and the quantitative analysis of the multiphase refractory layer. Due to the complexity of the CVD coating architecture, a thickness correction for the peak intensity was not applied.

The zirconia phase can be present in the multiphase refractory layer in any amount not inconsistent with the objectives of the present invention. In some embodiments, the zirconia phase is present in an amount of 5-60 weight percent of the multiphase refractory layer. The zirconia phase, in some embodiments, is present in an amount selected from Table II.

TABLE II

| ZrO$_2$ Content of Multiphase Refractory Layer (wt. %) |
|---|
| 10-50 |
| 20-40 |
| 30-40 |
| 5-30 |
| 5-25 |
| 35-50 |

The zirconia phase can primarily exhibit a monoclinic crystalline structure. In some embodiments, the zirconia phase comprises a mixture of monoclinic and tetragonal crystalline phases. For example, the zirconia phase can be 60-99.9% monoclinic with the remainder tetragonal. In other embodiments tetragonal phase is present in the zirconia phase in an amount of 1-35% or 5-30%.

The zirconia phase, in some embodiments, is a dispersed within an alumina phase. For example, the zirconia phase can be dispersed throughout the alumina phase. In other embodiments, the zirconia phase is heterogeneously distributed in the alumina phase, thereby producing one or more zirconia gradients. Additionally, grains of the zirconia phase can generally exhibit a columnar morphology. In some embodiments, for example, zirconia grains have an aspect ratio greater than 1.3 with the long axis normal or substantially normal to the substrate.

Further, the zirconia phase may exhibit low levels of residual tensile stress in the as-deposited state. In some embodiments, the zirconia phase exhibits residual tensile stress of 100-400 MPa in the as-deposited state. In other embodiments, tensile stress of the as-deposited zirconia phase ranges from 150-300 MPa. Residual stress and shear stress are determined by x-ray diffraction using the Chi tilt $Sin^2 \psi$ method with reference to the (002) reflection of the monoclinic zirconia crystalline phase. Data was collected on a Bragg diffractometer and processed as set forth above.

Peak data was then corrected for Absorption and Transparency using the following equations:
Absorption Correction $$A = \left[1 - \frac{\tan(\omega - \theta)}{\tan \theta}\right] \times \left[1 - e^{\left(-v\tau \times \frac{2\sin\theta \times \cos(\omega - \theta)}{\sin^2\theta - \sin^2(\omega - \theta)}\right)}\right]$$

Transparency Correction $$\Delta 2\theta = \frac{180}{\pi} \times \frac{2\tau}{R} \times \frac{\sin(\theta)\cos(\theta)}{\sin(\omega)}$$

$$\text{with } \tau = \frac{t}{\beta} \times \frac{(1-\beta)xe^{-\beta} - e^{-\beta}}{1-e^{-\beta}}$$

$$\text{and } \beta = \frac{2\mu t \sin\theta x \cos(\omega-\theta)}{\sin^2\theta - \sin^2(\omega-\theta)}$$

where:
t=thickness of layer
μ=linear absorption coefficient ($cm^{-1}$)
θ=2Theta/2 (degrees)
(ω−θ)=omega offset angle (degrees)
ψ=tilt angle (Psi stress) (degrees)
τ=information depth (microns)
R=Radius of goniometers (mm)

The peak data was corrected for Lorentz polarization using the following equation:

Polarization Correction $$LP = \frac{\cos^2 2\theta_{mon} \times \cos^2 2\theta}{\sin\theta}$$

$2\theta_{mon}$=diffraction angle of graphite monochromator

The $K\alpha_2$ peaks were removed using the Ladell model. Peak positions were refined using a Pearson shape profile function.

The residual stress was calculated from the general equation:

$$\frac{d_{\varphi\psi} - d_0}{d_0} = S_1(\sigma_1 + \sigma_2) + \frac{1}{2}S_2\sigma_\varphi\sin^2\psi$$

where $\sigma_\varphi = \sigma_1 \cos^2\varphi + \sigma_2 \sin^2\varphi$
$d_{\varphi\psi}$=lattice constant at angle φ and tilt ψ
$d_o$=strain free lattice constant
φ=rotation angle
ψ=specimen tilt
$\sigma_1$ & $\sigma_2$=primary stress tensors in specimen surface
$\sigma_\varphi$=stress at φ rotation angle
$S_1$ & ½ $S_2$=X-ray elastic constants $$S_1 = \frac{-\upsilon}{E} \quad \frac{1}{2}S_2 = \frac{1+\upsilon}{E}$$

For the present zirconia analysis, Poisson's Ratio (υ) was set to 0.23, and the elastic modulus (E in GPa) was determined from literature to be 220.

The alumina phase can be present in the multiphase refractory layer in any amount not inconsistent with the objectives of the present invention. In some embodiments, the alumina phase is the principal phase of the multiphase refractory layer. For example, the alumina phase can be present in an amount of 55-95 weight percent of the multiphase refractory layer. Alternatively, the alumina phase is present in an amount less than the zirconia phase. Depending on CVD conditions, the alumina phase can be α-alumina, κ-alumina or mixtures (α/κ) thereof. Moreover, the alumina phase can be doped with zirconium (Zr). In some embodiments, zirconium is present in the alumina phase in an amount of 0.1 to 5 weight percent of the alumina phase. Zirconium may also be present in the alumina phase in an amount selected from Table III.

TABLE III

| Zr Dopant (wt. % of Alumina Phase) |
| --- |
| 0.5-30 |
| 1-15 |
| 2-10 |
| 5-20 |

Figure 3:
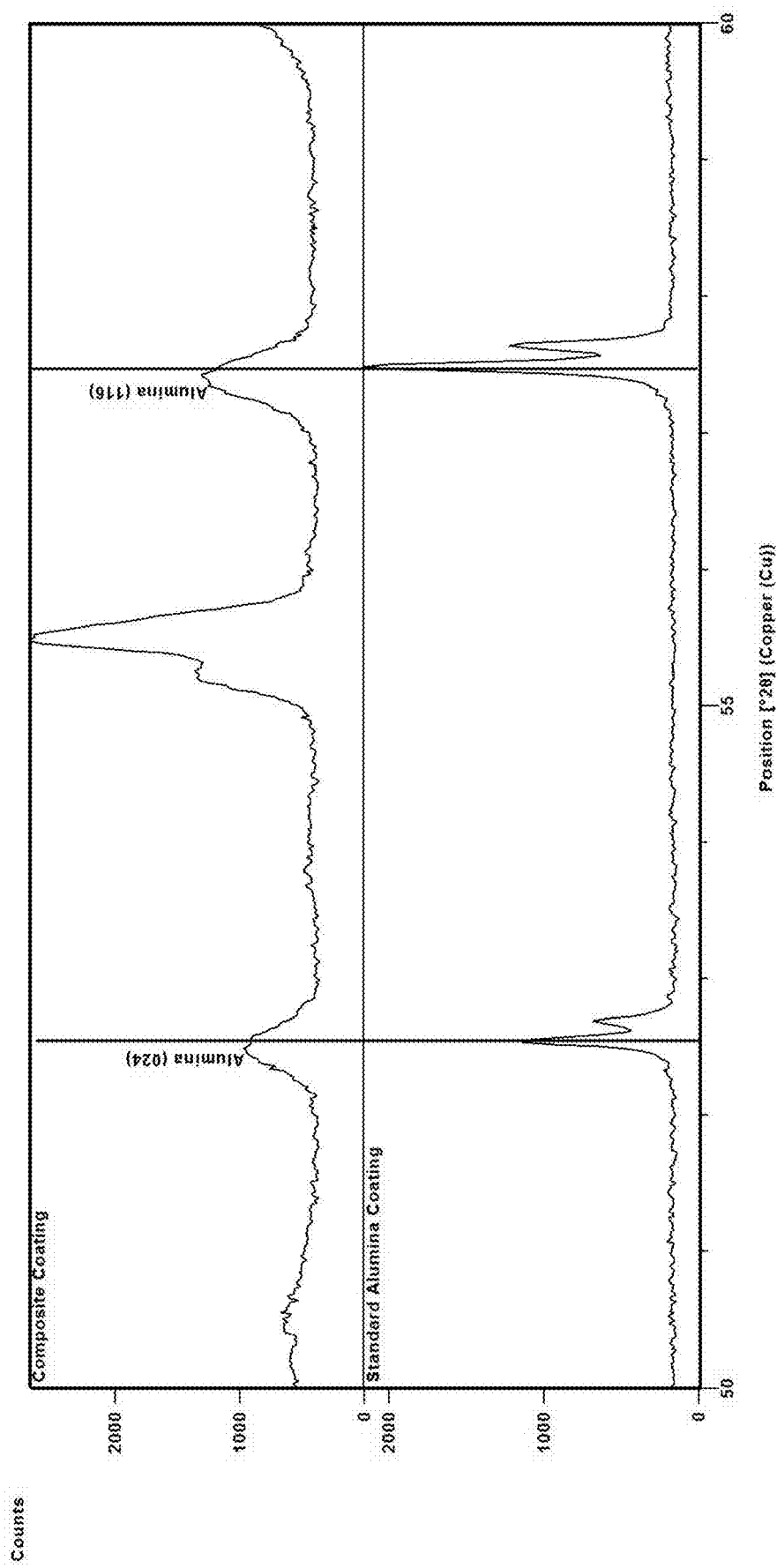
FIG. 3 compares XRD of zirconium-doped alumina of a composite coating of one embodiment described herein with XRD of standard alumina.

The presence of zirconium in the alumina phase necessarily alters the alumina lattice. Alteration of the alumina lattice by incorporation of zirconium is evidenced by XRD. FIG. 3 compares XRD of zirconium-doped alumina of a composite coating of one embodiment described herein with XRD of standard alumina. As illustrated in FIG. 3, the alumina (024) and (116) reflections show significant broadening due to zirconium induced lattice distortion.

Similar to the zirconia phase, grains of the alumina phase can also exhibit a columnar morphology with the long axis normal or substantially normal to the substrate. Further, the alumina phase can exhibit low residual tensile stress in the as-deposited state. In some embodiments, the alumina phase has a residual tensile stress of 200-600 MPa or 250-500 MPa in the as-deposited state. Residual stress of the alumina phase can be determined using the Chi tilt $\sin^2 \psi$ method with reference to the (116) reflection. For the alumina phase analysis, Poisson's Ratio (υ) was set to 0.19, and the elastic modulus (E in GPa) was determined to be 415 from analysis of a single phase α-alumina coating by nanoindentation hardness.

Quantitative analyses of the zirconia and alumina phases of the refractory layer are administered using the Rietveld method. Data is collected using a Bragg diffractometer and processed as set forth above. All phases in the collected pattern are identified and structure data is selected for each phase for the Rietveld analysis. To keep the Rietveld analysis consistent, the same structure data is used for all analyses of the coating. The structure data used is taken from the ICDD PDF4 2015 database. The structure data used is from the following cards:
04-001-7278 Zirconium Oxide (tetragonal)
04-004-4339 Zirconium Oxide (monoclinic)
04-006-0204 Titanium OxyCarbonNitride
03-065-9875 Titanium Carbonitride
04-006-9359 Alumina (alpha)
04-012-6907 Alumina (kappa)
04-016-3697 Tungsten Carbide In the Rietveld refinement parameters for the collected data is corrected for:
Specimen Displacement
Zero Shift
Background profiled using the Chebyshev profile Rietveld refinement parameters for each phase are:
Scale factor
Lattice parameters
Caglioti V
Caglioti W Any orientation in the patterns is corrected using spherical harmonics. To insure the correctness of the Rietveld refinement all phases in the sample need to be refined. Refinement is continued until a Goodness of Fit of at least 0.9 (90%) is achieved. Once refinement is complete all phases other than the phase in the composite layer are removed from the refinement and the composite layer phases are normalized to 100%.

The multiphase refractory layer can have any thickness not inconsistent with the objectives of the present invention. In some embodiments, the multiphase refractory layer comprising alumina and zirconia phases has thickness of 0.1 µm-15 µm. Thickness of the multiphase refractory layer can be selected from Table IV.

TABLE IV

Multiphase Refractory Layer Thickness (µm)

0.5-10
1-5
5-10
0.1-5

The multiphase refractory layer comprising alumina and zirconia phases can be deposited directly on the substrate surface. Alternatively, a coating described herein can further comprise one or more inner layers between the multiphase refractory layer and the substrate. Inner layer(s), in some embodiments, comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. In some embodiments, one or more inner layers between the substrate and multiphase refractory layer comprise a carbide, nitride, carbonitride, oxycarbonitride, oxide or boride of one or more metallic elements selected from the group consisting of aluminum and metallic elements of Groups IVB, VB and VIB of the Periodic Table.

For example, one or more inner layers are selected from the group consisting of titanium nitride, titanium carbonitride, titanium oxycarbonitride, titanium carbide, zirconium nitride, zirconium carbonitride, hafnium nitride and hafnium carbonitride. Further, a layer of titanium oxycarbonitride can be employed as a bonding layer for the refractory layer and inner layers of the coating. Inner layer(s) of the coating can have any thickness not inconsistent with the objectives of the present invention. In some embodiments, a single inner layer can have a thickness of at least 1.5 µm. Alternatively, a plurality of inner layers can collectively achieve thickness of at least 1.5 µm.

The multiphase refractory layer comprising alumina and zirconia phases can be the outermost layer of the coating. Alternatively, a coating described herein can comprise one or more outer layers over the multiphase refractory layer. Outer layer(s) can comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. Outer layer(s) over the refractory layer can comprise a carbide, nitride, carbonitride, oxycarbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium oxycarbonitride, titanium carbide, zirconium nitride, zirconium carbonitride, hafnium nitride, hafnium carbonitride and alumina and mixtures thereof.

Outer layers of coatings described herein can have any thickness not inconsistent with the objectives of the present invention. A coating outer layer, in some embodiments, can have a thickness ranging from 0.2 µm to 5 µm.

Coatings described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting and steam blasting. Wet blasting, for example, is accomplished using a slurry of inorganic and/or ceramic particles, such as alumina, and water. The particle slurry can be pneumatically projected at a surface of the coated cutting tool body to impinge on the surface of the coating. The inorganic and/or ceramic particles can generally range in size between about 20 µm and about 100 µm.

Blasting parameters include pressure, angle of impingement, distance to the part surface and duration. In some embodiments, angle of impingement can range from about 10 degrees to about 90 degrees, i.e., the particles impinge the coating surface at an angle ranging from about 10 degrees to about 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 µm to 10 µm. In one embodiment, a 5-10 µm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the cutting tool.

A coating described herein can be blasted or polished for a time period sufficient to achieve a desired surface roughness ($R_a$) and/or other parameters such as reducing residual tensile stress in the coating. In some embodiments, a coating subjected to post-coat treatment has a surface roughness ($R_a$) selected from Table V.

TABLE V

Post-Coat Surface Roughness ($R_a$)
Coating Surface Roughness ($R_a$) - nm

≤500
≤250
<200
10-250
50-175
25-150

Coating surface roughness can be determined by optical profilometry using WYKO® NT-Series Optical Profilers commercially available from Veeco Instruments, Inc. of Plainview, N.Y.

Further, a post-coat treatment, in some embodiments, does not remove one or more outer layers of the coating. In some embodiments, for example, a post-coat treatment does not remove an outer layer of TiN, TiCN and/or TiOCN.

Alternatively, a post-coat treatment can remove or partially remove one or more outer layers, such as TiN, TiCN and TiOCN.

As described herein, the multiphase refractory layer is deposited by CVD. The multiphase refractory layer can be deposited from a gaseous mixture of $H_2$, $N_2$, $CO_2$, HCl, $AlCl_3$, $ZrCl_4$ and $H_2S$. The $AlCl_3$ and $ZrCl_4$ can be simultaneously introduced into the deposition chamber during initiation and growth of the multiphase refractory layer. The presence of $ZrCl_4$ during nucleation of the multiphase refractory layer differs from prior techniques where an alumina layer is first nucleated and $ZrCl_4$ is subsequently introduced during alumina layer growth. The present CVD method also differentiates prior techniques where alumina and zirconia layers are grown independently of one another in a layered format. In some embodiments, $AlCl_3$ and $ZrCl_4$ are formed in separate generators from metal chips and HCl at 350-400° C. General CVD processing parameters for depositing the multiphase refractory layer are provided in Table VI.

TABLE VI

Multiphase Refractory Layer CVD Processing Parameters

| Process Step | $H_2$ vol. % | $N_2$ vol. % | $CO_2$ vol. % | HCl vol. % | $H_2S$ vol. % | $AlCl_3$ vol. % | $ZrCl_4$ vol. % |
|---|---|---|---|---|---|---|---|
| $Al_2O_3$/$ZrO_2$ Layer | Bal. | 4-6 | 4-6 | 1.5-2 | 0.05-0.15 | 1.5-3 | 1.5-2.5 |

The multiphase refractory layer can be deposited directly on the substrate surface. Alternatively, one or more coating inner layers can reside between the substrate and multiphase refractory layer. General CVD deposition parameters for various inner layers are provided in Table VII.

TABLE VII

CVD Parameters for Inner layer Deposition

| Base Layer Composition | Gas Mixture | Temperature ° C. | Pressure mbar | Duration min. |
|---|---|---|---|---|
| TiN | $H_2$, $N_2$, $TiCl_4$ | 800-900 | 60-100 | 10-90 |
| MT-TiCN | $H_2$, $N_2$, $TiCl_4$, $CH_3CN$ | 750-900 | 65-100 | 50-400 |
| HT-TiCN | $H_2$, $N_2$, $TiCl_4$, $CH_4$ | 900-1050 | 60-160 | 30-200 |
| TiOCN | $H_2$, $N_2$, $TiCl_4$, $CH_4$, CO | 900-1050 | 200-550 | 30-70 |

The foregoing general CVD parameters for inner layer deposition, in some embodiments, can be applied for deposition of one or more outer layers over the refractory layer.

These and other embodiments are further illustrated in the following non-limiting examples.

EXAMPLE 1

Coated Cutting Tools

Coated cutting tools described herein were produced by placing cemented tungsten carbide (WC-Co) cutting insert substrates [ANSI standard geometry CNMG432RN] into an axial flow hot-wall CVD reactor. The cutting inserts comprised 6 wt. % cobalt binder with the balance WC grains of size 1-5 μm. A coating including a multiphase refractory layer described herein was deposited on the cutting inserts according to Tables VIII and IX. The multiphase refractory layer included a Zr-doped alumina phase and zirconia phase. An outer layer of TiN was deposited over the nanocomposite refractory layer to complete the coating. Alternatively, if desired, an outer layer of TiOCN can be deposited over the nanocomposite refractory layer to complete the coating.

TABLE VIII

CVD Deposition of Coating

| Process Step | $H_2$ vol. % | $N_2$ vol. % | $TiCl_4$ vol. % | $CH_3CN$ vol. % | $CH_4$ vol. % | $CO_2$ vol. % | CO vol. % | HCl vol. % | $H_2S$ vol. % | $AlCl_3$ vol. % | $ZrCl_4$ vol. % |
|---|---|---|---|---|---|---|---|---|---|---|---|
| TiN | 33.5 | 22.3 | 0.03 | — | — | — | — | — | — | — | — |
| MT-TiCN | 54.5 | 8.2 | 0.05 | 0.01 | — | — | — | — | — | — | — |
| HT-TiCN | 50.7 | 40.5 | 0.06 | — | 2.6 | — | — | — | — | — | — |
| TiOCN | 73.9 | 14.8 | 0.06 | — | 3.8 | — | 1.5 | — | — | — | — |
| $ZrAl_2O_3$/$ZrO_2$ Composite | 83.3 | 4.6 | — | — | — | 5.6 | — | 1.9 | 0.1 | 2.8 | 1.9 |
| TiN (Outer Layer) | 55.9 | 38.4 | 0.06 | — | — | — | — | — | — | — | — |
| TiOCN* (Outer Layer) | 50.0 | 40.0 | 0.06 | — | 2.8 | — | 1.2 | — | — | — | — |

*Alternative outer layer

TABLE IX

CVD Deposition Steps

| Process Step | Temperature °C. | Pressure mbar | Time min. |
|---|---|---|---|
| TiN | 850-960 | 60-90 | 10-90 |
| MT-TiCN | 900-940 | 70-100 | 50-400 |
| HT-TiCN | 900-1050 | 60-150 | 30-200 |
| TiOCN | 950-1050 | 200-500 | 30-70 |
| ZrAl$_2$O$_3$/ZrO$_2$ Composite | 950-1050 | 50-120 | 10-500 |
| TiN (Outer Layer) | 850-960 | 60-90 | 10-90 |
| TiOCN (Outer Layer)* | 950-1050 | 200-500 | 30-180 |

*Alternative outer layer

The resulting coating exhibited the properties provided in Table X.

TABLE X

Properties of CVD Coating

| Coating Layers | Thickness (μm) |
|---|---|
| TiN | 0.7 |
| MT-TiCN | 8.4 |
| HT-TiCN/TiOCN | 1.1 |
| ZrAl$_2$O$_3$/ZrO$_2$ Composite | 10.6 |
| TiN* | 1.6 |

*Removed by post-coat treatment

Figure 4:
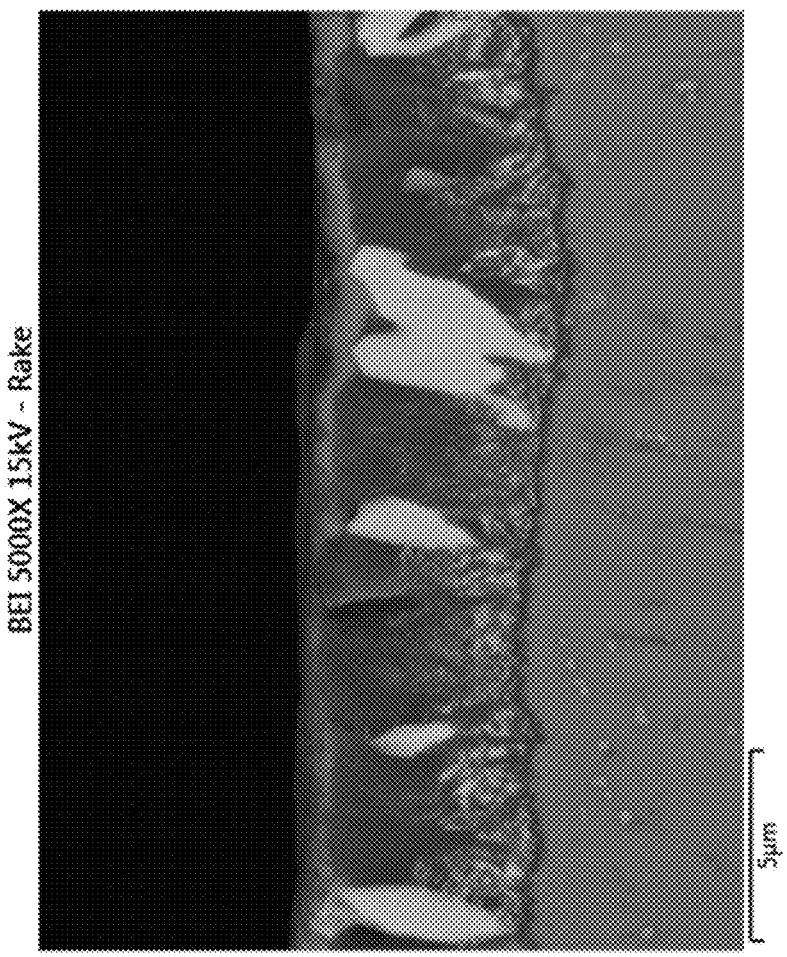
FIG. 4 is a cross-sectional scanning electron microscopy (SEM) image of a multiphase refractory layer according to one embodiment described herein.

The TiN outer layer listed in Table X was subsequently removed via particulate slurry post-coat treatment described hereinabove. The coated cutting inserts exhibited zirconia phases having an average TC(200) of 5.2. FIG. 4 is a cross-sectional SEM of the multiphase refractory layer taken from one cutting insert of the present example. As illustrated in the SEM, the multiphase refractory layer comprises zirconia (light phase) dispersed in alumina (dark phase). The zirconia phase can include large grains as well as small crystallites throughout the alumina matrix.

EXAMPLE 2

Coated Cutting Tools

Coated cutting tools described herein were produced by placing cemented tungsten carbide (WC-Co) cutting insert substrates [ANSI standard geometry CNMG432RN] into an axial flow hot-wall CVD reactor. The cutting inserts comprised 6 wt. % cobalt binder with the balance WC grains of size 1-5 μm. A coating including a multiphase refractory layer comprising described herein was deposited on the cutting inserts according to Table XI. The multiphase refractory layer included a Zr-doped alumina phase and zirconia phase. An outer layer of TiN was deposited over the nanocomposite refractory layer to complete the coating. Alternatively, if desired, an outer layer of TiOCN can be deposited over the nanocomposite refractory layer to complete the coating.

TABLE XI

CVD Deposition of Coating

| Process Step | H$_2$ vol. % | N$_2$ vol. % | TiCl$_4$ vol. % | CH$_3$CN vol. % | CH$_4$ vol. % | CO$_2$ vol. % | CO vol. % | HCl vol. % | H$_2$S vol. % | AlCl$_3$ vol. % | ZrCl$_4$ vol. % |
|---|---|---|---|---|---|---|---|---|---|---|---|
| TiN | 33.5 | 22.3 | 0.03 | — | — | — | — | — | — | — | — |
| MT-TiCN | 54.5 | 8.2 | 0.05 | 0.01 | — | — | — | — | — | — | — |
| HT-TiCN | 50.7 | 40.5 | 0.06 | — | 2.6 | — | — | — | — | — | — |
| TiOCN | 73.9 | 14.8 | 0.06 | — | 3.8 | — | 1.5 | — | — | — | — |
| ZrAl$_2$O$_3$/ZrO$_2$ Composite | 85.6 | 4.8 | — | — | — | 4.1 | — | 1.9 | 0.1 | 1.6 | 1.9 |
| TiN (Outer Layer) | 55.9 | 38.4 | 0.06 | — | — | — | — | — | — | — | — |
| TiOCN* (Outer Layer) | 50.0 | 40.0 | 0.06 | — | 2.8 | — | 1.2 | — | — | — | — |

*Alternative outer layer

Figure 5:
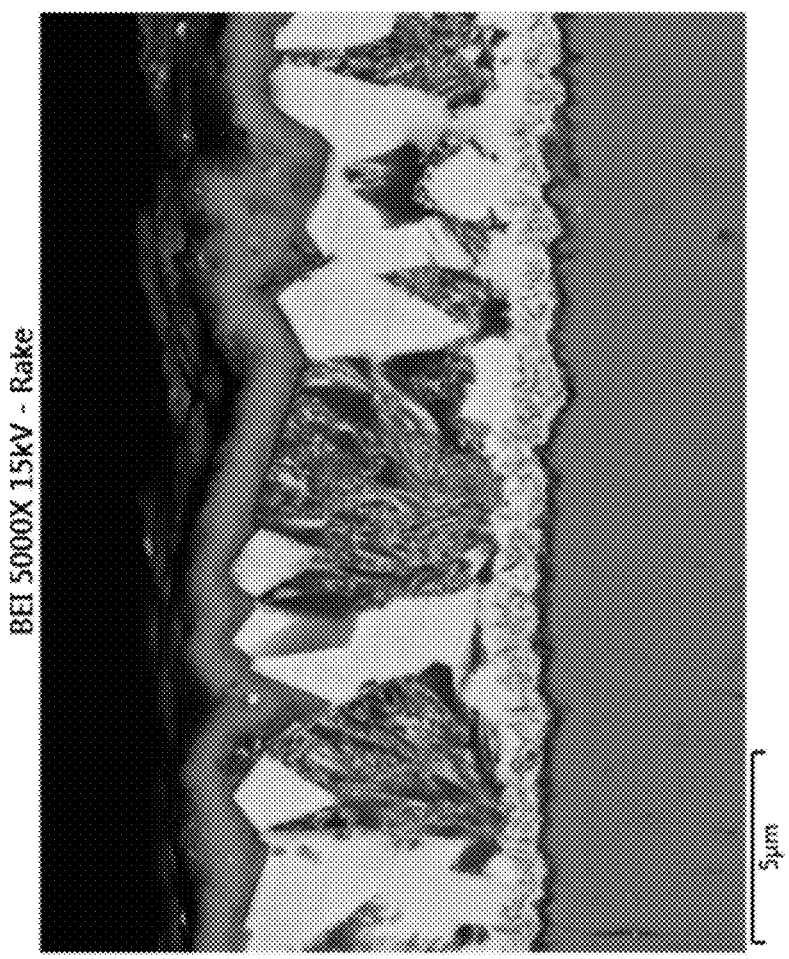
FIG. 5 is a cross-sectional SEM image of a multiphase refractory layer according to one embodiment described herein.

Time, temperatures and pressures for the deposition are provided in Table IX. The resulting coatings exhibited the properties provided in Table XII. The TiN outer layer listed in Table XII was subsequently removed via a particulate slurry post-coat treatment described hereinabove. The coated cutting inserts exhibited zirconia phases having an average TC(200) of 4.15. FIG. 5 is a cross-sectional SEM of the multiphase refractory layer taken from one cutting insert of the present example. Large zirconia grains are present as well as smaller crystallites.

TABLE XII

Properties of CVD Coating

| Coating Layers | Thickness (μm) |
|---|---|
| TiN | 0.5 |
| MT-TiCN | 8.3 |
| HT-TiCN/TiOCN | 1.0 |
| ZrAl$_2$O$_3$/ZrO$_2$ Composite | 7.7 |
| TiN* | 1.6 |

*Removed by post-coat treatment

EXAMPLE 3

Coated Cutting Tools

Coated cutting tools were produced by placing cemented tungsten carbide (WC-Co) cutting insert substrates [ANSI standard geometry CNMG432RN] into an axial flow hot-wall CVD reactor. The cutting inserts comprised 6 wt. % cobalt binder with the balance WC grains of size 1-5 µm. A coating including a multiphase refractory layer comprising described herein was deposited on the cutting inserts according to Table XIII. The multiphase refractory layer included a Zr-doped alumina phase and zirconia phase. An outer layer of TiN was deposited over the nanocomposite refractory layer to complete the coating. Alternatively, if desired, an outer layer of TiOCN can be deposited over the nanocomposite refractory layer to complete the coating.

TABLE XIII

CVD Deposition of Coating

| Process Step | $H_2$ vol. % | $N_2$ vol. % | $TiCl_4$ vol. % | $CH_3CN$ vol. % | $CH_4$ vol. % | $CO_2$ vol. % | CO vol. % | HCl vol. % | $H_2S$ vol. % | $AlCl_3$ vol. % | $ZrCl_4$ vol. % |
|---|---|---|---|---|---|---|---|---|---|---|---|
| TiN | 33.5 | 22.3 | 0.03 | — | — | — | — | — | — | — | — |
| MT-TiCN | 54.5 | 8.2 | 0.05 | 0.01 | — | — | — | — | — | — | — |
| HT-TiCN | 50.7 | 40.5 | 0.06 | — | 2.6 | — | — | — | — | — | — |
| TiOCN | 73.9 | 14.8 | 0.06 | — | 3.8 | — | 1.5 | — | — | — | — |
| $ZrAl_2O_3/ZrO_2$ Composite | 84.6 | 4.7 | — | — | — | 5.0 | — | 1.9 | 0.03 | 1.9 | 1.9 |
| TiN (Outer Layer) | 55.9 | 38.4 | 0.06 | — | — | — | — | — | — | — | — |
| TiOCN* (Outer Layer) | 50.0 | 40.0 | 0.06 | — | 2.8 | — | 1.2 | — | — | — | — |

*Alternative outer layer

Figure 6:
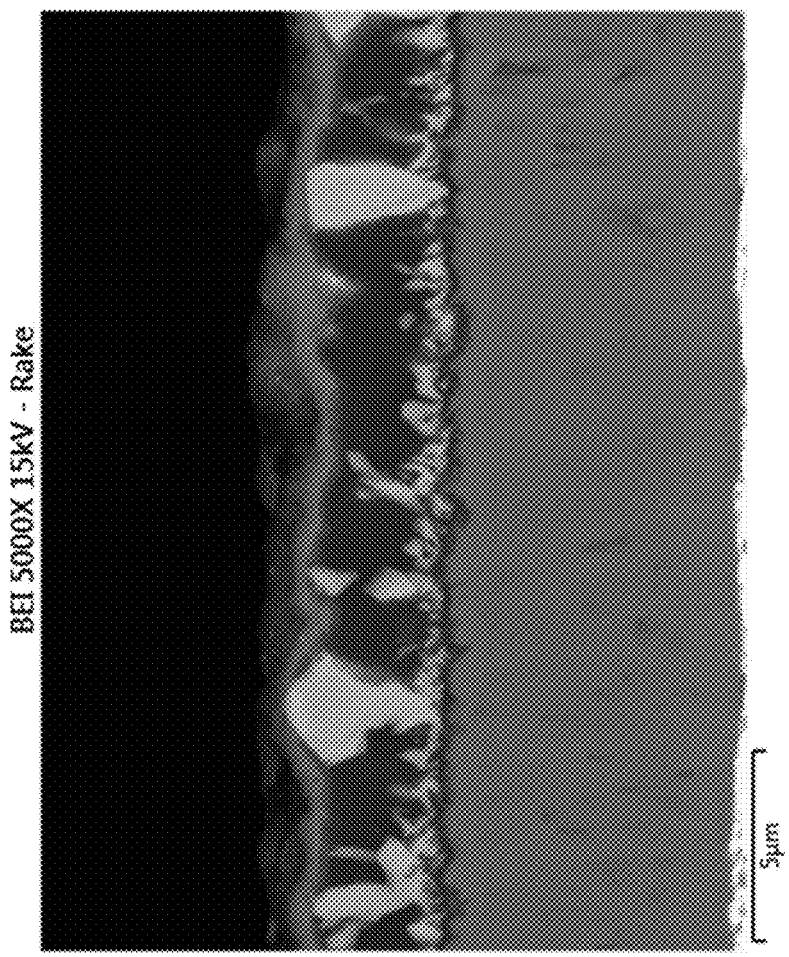
FIG. 6 is a cross-sectional SEM image of a multiphase refractory layer.

Time, temperatures and pressures for the deposition are provided in Table IX. The resulting coatings exhibited the properties provided in Table XIV. The TiN outer layer listed in Table XIV was subsequently removed via a particulate slurry post-coat treatment described hereinabove. The coated cutting inserts exhibited zirconia phases having an average TC(200) of 3.5. FIG. 6 is a cross-sectional SEM of the multiphase refractory layer taken from one cutting insert of the present example.

TABLE XIV

Properties of CVD Coating

| Coating Layers | Thickness (µm) |
|---|---|
| TiN | 0.7 |
| MT-TiCN | 8.6 |
| HT-TiCN/TiOCN | 1.0 |
| $ZrAl_2O_3/ZrO_2$ Composite | 9.9 |
| TiN* | 1.6 |

*Removed by post-coat treatment

EXAMPLE 4

Metal Cutting Testing

Coated cutting inserts of Examples 1-3 and Comparative 1 were subjected to continuous turning testing according to the parameters below. Comparative 1 employed the same cemented carbide substrate as Examples 1-3 and exhibited the coating architecture of Table XV.

TABLE XV

Properties of CVD Coating of Comparative 1

| Coating Layers | Thickness (µm) |
|---|---|
| TiN | 0.7 |
| MT-TiCN | 8.5 |
| HT-TiCN/TiOCN | 1.1 |
| $Al_2O_3$ | 5.3 |

The CVD coating of Comparative 1 included a TiN outer layer that was subsequently removed via a particulate slurry postcoat treatment described hereinabove. For the turning testing, end of life (EOL) was registered by flank wear (VB)>0.3 mm. The cutting lifetime of Comparative 1 was normalized to represent a lifetime of 100%.

Turning Parameters
Workpiece: 4340 Steel
Speed: 750 sfm
Feed Rate: 0.012 ipr
Depth of Cut: 0.1 mm
Lead Angle: −5°
The results of the continuous turning testing are provided in Table XVI.

TABLE XVI

Continuous Turning Testing Results

| Coated Cutting Insert | Lifetime (%) |
|---|---|
| Comparative 1 | 100 |
| Example 1 | 118 |
| Example 2 | 113 |
| Example 3 | 89 |

As provided in Table XVI, coating cutting inserts of Examples 1 and 2 having a zirconia TC(200) greater than 4 provided significant enhancements to cutting lifetimes. Cutting inserts of Example 3 wherein the TC(200) was less than 4 failed to match the performance of Comparative 1.

EXAMPLE 5

Metal Cutting Testing

Coated cutting inserts of Examples 1-3 and Comparative 1 were subjected to continuous turning testing according to the parameters below. For the turning testing, end of life (EOL) was registered by crater wear (CW)>0.1 mm. The cutting lifetime of Comparative 1 was normalized to represent a lifetime of 100%.

Turning Parameters
Workpiece: 1045 Steel
Speed: 1000 sfm
Feed Rate: 0.012 ipr
Depth of Cut: 0.08 mm
Lead Angle: −5°
The results of the continuous turning testing are provided in Table XVII.

TABLE XVII

Continuous Turning Testing Results

| Coated Cutting Insert | Lifetime (%) |
|---|---|
| Comparative 1 | 100 |
| Example 1 | 159 |
| Example 2 | 100 |
| Example 3 | 134 |

As provided in Table XVII, coating cutting inserts of Examples 1 and 3 provided significant enhancements to cutting lifetimes. Cutting inserts of Example 2 equaled the performance of Comparative 1.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated article comprising:
a substrate; and
a coating deposited by chemical vapor deposition (CVD) adhered to the substrate, the coating including a multiphase refractory layer comprising an alumina phase and zirconia phase, wherein the zirconia phase has a texture coefficient for the (200) growth direction, TC(200), greater than 4, the texture coefficient (TC) being defined as:

$$TC(hkl) = \frac{I(hkl)}{I_o(hkl)} \left\{ \frac{1}{n} \sum \frac{I(hkl)}{I_o(hkl)} \right\}^{-1}$$

where
I(hkl)=measured intensity of the (hkl) reflection
$I_o$(hkl)=standard intensity of the (hkl) reflection according to International Center for Diffraction Data (ICDD) card 00-037-1484
n=number of reflections used in the TC calculation
(hkl) reflections used in the TC calculation are (−111), (111), (200), (−112), (220) and (−221), and
wherein grains of the zirconia phase are columnar.

2. The coated article of claim 1, wherein the TC(200) is greater than 4.5.

3. The coated article of claim 1, wherein the TC(200) is greater than 5.

4. The coated article of claim 1, wherein the TC(200) is from 4.1 to 6.

5. The coated article of claim 1, wherein the zirconia grains have an aspect ratio greater than 3.

6. The coated article of claim 1, wherein the zirconia phase exhibits residual tensile stress.

7. The coated article of claim 6, wherein the residual tensile stress ranges from 100-400 MPa in the as-deposited state.

8. The coated article of claim 1, wherein the alumina phase exhibit residual tensile stress.

9. The coated article of claim 8, wherein the residual tensile stress ranges from 200-600 MPa in the as-deposited state.

10. The coated article of claim 1, wherein the alumina phase is α-alumina, κ-alumina or mixtures thereof.

11. The coated article of claim 1, wherein the zirconia phase primarily exhibits monoclinic crystalline structure.

12. The coated article of claim 1, wherein the zirconia phase comprises a mixture of monoclinic and tetragonal crystalline phases.

13. The coated article of claim 12, wherein the zirconia phase is 60-99.9% monoclinic.

14. The coated article of claim 12, wherein the zirconia phase is 1-10% tetragonal.

15. The coated article of claim 1, wherein the coating further comprises one or more inner layers between the multiphase refractory layer and substrate.

16. The coated article of claim 15, wherein the one or more inner layers comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table.

17. The coated article of claim 1, wherein the coating further comprises one or more outer layers over the multiphase refractory layer.

18. The coated article of claim 1, wherein the substrate comprises cemented carbide comprising metallic binder in an amount of 1-15 weight percent.

19. The coated article of claim 1, wherein the substrate comprises cemented carbide comprising metallic binder in an amount of 5-12 weight percent.

20. The coated article of claim 1, wherein the substrate is a cutting tool.

* * * * *